(12) United States Patent
Hoffbauer et al.

(10) Patent No.: US 7,759,229 B2
(45) Date of Patent: Jul. 20, 2010

(54) CHARGE-FREE METHOD OF FORMING NANOSTRUCTURES ON A SUBSTRATE

(75) Inventors: Mark Hoffbauer, Los Alamos, NM (US); Elshan Akhadov, Los Alamos, NM (US)

(73) Assignee: Los Alamos National Security, LLC, Los Alamos, NM (US)

( * ) Notice: Subject to any disclaimer, the term of this patent is extended or adjusted under 35 U.S.C. 154(b) by 822 days.

(21) Appl. No.: 11/603,516

(22) Filed: Nov. 21, 2006

(65) Prior Publication Data

US 2007/0114207 A1    May 24, 2007

Related U.S. Application Data

(60) Provisional application No. 60/738,624, filed on Nov. 21, 2005.

(51) Int. Cl.
*H01L 21/20* (2006.01)
*H01L 21/36* (2006.01)

(52) U.S. Cl. ............ 438/479; 438/22; 438/41; 438/222; 438/226; 438/481; 257/E21.001; 257/E21.092; 257/E21.093

(58) Field of Classification Search ......... 438/476–479, 438/22, 41, 222, 226, 481; 257/E21.001, 257/E21.092, E21.093
See application file for complete search history.

(56) References Cited

U.S. PATENT DOCUMENTS

| 4,780,608 | A | 10/1988 | Cross et al. |
| 5,271,800 | A | 12/1993 | Koontz et al. |
| 7,393,762 | B2 * | 7/2008 | Hoffbauer et al. ........... 438/479 |

* cited by examiner

*Primary Examiner*—Alexander G Ghyka
*Assistant Examiner*—Abdulfattah Mustapha
(74) *Attorney, Agent, or Firm*—Robert P. Santandrea; Bruce H. Cottrell; Juliet A. Jones

(57) ABSTRACT

A charge-free method of forming a nanostructure at low temperatures on a substrate. A substrate that is reactive with one of atomic oxygen and nitrogen is provided. A flux of neutral atoms of least one of oxygen and nitrogen is generated within a laser-sustained-discharge plasma source and a collimated beam of energetic neutral atoms and molecules is directed from the plasma source onto a surface of the substrate to form the nanostructure. The energetic neutral atoms and molecules in the beam have an average kinetic energy in a range from about 1 eV to about 5 eV.

19 Claims, 5 Drawing Sheets a)

b)

CHARGE-FREE METHOD OF FORMING NANOSTRUCTURES ON A SUBSTRATE

REFERENCE TO PRIOR APPLICATION

This application claims the benefit of U.S. Provisional Application No. 60/738,624, filed Nov. 21, 2005.

STATEMENT REGARDING FEDERAL RIGHTS

This invention was made with government support under Contract No. DE-AC 52-06 NA 25396 awarded by the U.S. Department of Energy. The government has certain rights in the invention.

BACKGROUND OF INVENTION

The invention relates to the formation of nanoscale structures on a substrate. More particularly, the invention relates to the use of etching to form such nanoscale structures. Even more particularly, the invention relates to charge-free, low temperature etching of substrates using energetic neutral atom beam lithography and epitaxy.

Plasma etching is widely used to fabricate high-precision micron- and nanoscale structures in polymers. Plasma etching, however, represents a significant technical challenge. Problems associated with charge deposition, structural damage, and complex etch chemistries pose significant limitations for fabricating nanoscale structures and devices and limit the ability to form novel device structures.

Currently, the use of etching to form nanoscale structures cannot be made without incurring substantial structural damage or device damage inherent to the use of energetic charged particle-based etching processes. Therefore, what is needed is a method of forming nanoscale structures and devices that does not produce damage in the in the nanoscale structures and the substrate. What is also needed is a method of etching that is capable of forming such nanoscale structures with high precision.

SUMMARY OF INVENTION

The present invention meets these and other needs by providing a method of fabricating nanostructures at low temperatures in a charge-free environment using energetic neutral atom beam lithography and epitaxy (also referred to herein as "ENABLE"). This technique uses a flux of neutral atoms to form nanostructures, such as etched features, on the substrate.

Accordingly, one aspect of the invention is to provide a method of forming a plurality of nanostructures on a substrate. The method comprises the steps of: providing the substrate; introducing at least one of oxygen and nitrogen into a plasma within a laser-sustained-discharge plasma source, wherein the plasma energizes, dissociates, and heats at least one of oxygen and nitrogen; extracting a collimated flux of energetic neutral atoms and molecules of at least one of oxygen and nitrogen from the plasma source; and directing the collimated flux from the plasma source onto a surface of the substrate to etch the substrate, wherein etching the substrate forms the plurality of nanostructures, wherein the neutral atoms and molecules in the collimated flux have an average kinetic energy in a range from about 1 eV to about 5 eV.

A third aspect of the invention is to provide a method of etching a substrate. The method comprises the steps of: providing the substrate, wherein the substrate is reactive with energetic atoms of at least one of atomic oxygen and nitrogen and has a surface having a masked portion and an unmasked portion; introducing at least one of oxygen and nitrogen into a plasma within a plasma source, wherein the plasma energizes, dissociates, and heats the at least one of oxygen and nitrogen; extracting a collimated flux of energetic neutral atoms and molecules of at least one of oxygen and nitrogen from the plasma source; and directing the collimated flux from the plasma source onto the surface of the substrate to etch the unmasked portion of the substrate, wherein the energetic neutral atoms and the molecules in the collimated flux have an average kinetic energy in a range from about 1 eV to about 5 eV.

A fourth aspect of the invention is to provide a plurality of nanostructures disposed on a substrate, wherein the plurality of nanostructures is formed by: providing the substrate, wherein the substrate is reactive with energetic atoms of at least one of atomic oxygen and nitrogen; introducing at least one of oxygen and nitrogen into a plasma within a plasma source, wherein the plasma energizes, dissociates, and heats the at least one of oxygen and nitrogen; extracting a collimated flux of energetic neutral atoms and molecules of at least one of oxygen and nitrogen from the plasma source; and directing the collimated flux from the plasma source onto a surface of the substrate to etch the substrate, wherein etching the substrate forms the plurality of nanostructures, wherein the energetic neutral atoms and molecules in the collimated flux have an average kinetic energy in a range from about 1 eV to about 5 eV.

A fifth aspect of the invention is to provide an article comprising a plurality of etched nanostructures disposed on a surface of a substrate. Each of the plurality of etched nanostructures has a length and a width, and an aspect ratio of at least 5:1, and wherein the aspect ratio is a ratio of the length of the etched nanostructure to the width of the etched nanostructure.

These and other aspects, advantages, and salient features of the present invention will become apparent from the following detailed description, the accompanying drawings, and the appended claims.

DETAILED DESCRIPTION

Figure 1:
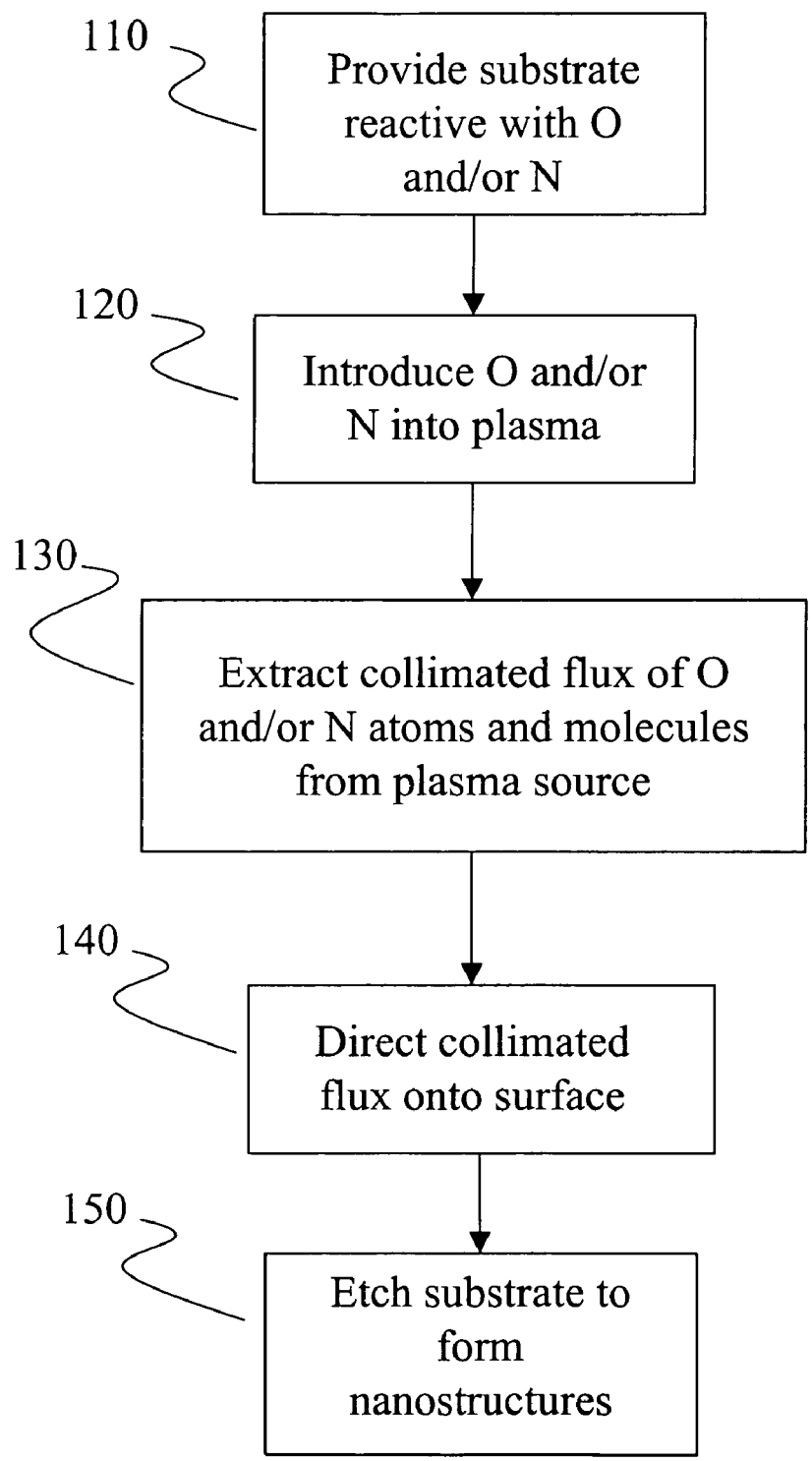
FIG. 1 is a flow chart for a method of making a nanostructure on a substrate.

In the following description, like reference characters designate like or corresponding parts throughout the several views shown in the figures. It is also understood that terms such as "top," "bottom," "outward," "inward," and the like are words of convenience and are not to be construed as limiting terms. In addition, whenever a group is described as either comprising or consisting of at least one of a group of elements and combinations thereof, it is understood that the group may comprise or consist of any number of those elements recited, either individually or in combination with each other.

Referring to the drawings in general and to FIG. 1 in particular, it will be understood that the illustrations are for the purpose of describing a particular embodiment of the invention and are not intended to limit the invention thereto. Turning to FIG. 1, a flow chart for a method of making a plurality of nanostructures on a substrate is shown. As used herein, a plurality of nanostructures is understood to include any structures or features that are formed by either etching or addition of a material to the substrate, wherein such defined features have at least one dimension (e.g., length, diameter, width, or depth) of less than about 100 nm. In one embodiment, individual nanoscale features have at least one dimension of at least 20 nm. In another embodiment, features as small as 1 nm may be achieved.

In Step 110, a substrate is provided. The substrate is reactive with respect to energetic (i.e., having kinetic energy in a range from about 1 eV to about 5 eV) oxygen atoms (also referred to herein as "O-atoms"), nitrogen atoms (also referred to herein as "N-atoms"), or both to form volatile (i.e., gaseous) compounds that would be removed from the substrate surface in high vacuum conditions. While the formation of nanostructures using O-atoms is described below, it is understood that such formation may be carried as well using out with N-atoms—either solely or in combination with O-atoms—instead. Formation of non-volatile compounds would effectively serve as an etch stop that limits further erosion of the substrate.

In one embodiment, the substrate is a polymeric substrate. Non-limiting examples of such polymeric substrates include, but are not limited to, polyimides, polymethyl methacrylate (PMMA), Shipley SU-8 photoresist, polycarbonates, perfluorinated cyclobutane (PFCB), and combinations thereof. Alternatively, the substrate may comprise highly oriented pyrolytic carbon (HOPC), glassy carbon, diamond, and combinations thereof.

In Step 120, neutral atoms and molecules of least one of oxygen and nitrogen are introduced into a plasma within a laser-sustained-discharge plasma source. A collimated flux or beam of energetic neutral atoms and molecules are then extracted from the plasma source (Step 130) and directed onto a surface of the substrate (Step 140) and used to etch the substrate and form the nanostructure (Step 150). The energetic neutral atoms and molecules extracted from the plasma have an average kinetic energy in a range from about 1 eV to about 5 eV. In one embodiment, the collimated flux is at least $10^{14}$ neutral atoms and molecules/cm$^2$·sec. In another embodiment, the collimated flux is in a range from about $10^{14}$ neutral atoms and molecules/cm$^2$·sec to about $10^{18}$ neutral atoms and molecules/cm$^2$·sec.

Figure 2:
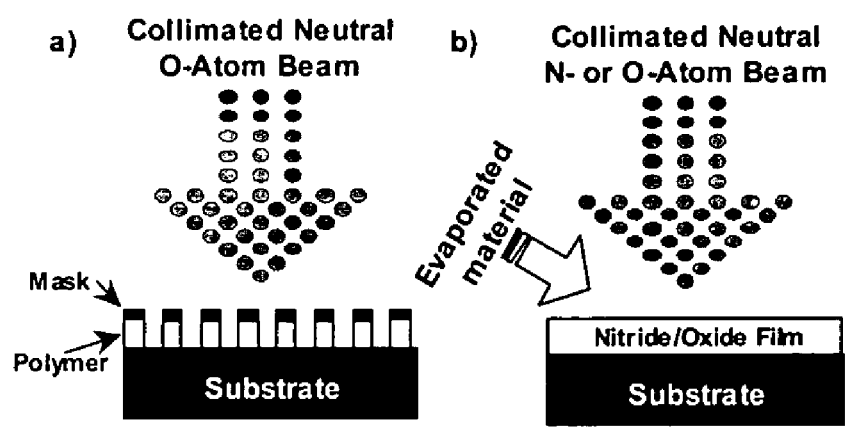
FIG. 2 is a schematic representation of: a) energetic neutral atom beam lithography and epitaxy (ENABLE) applied to etching a substrate; and b) application of ENABLE to form oxide or nitride materials.

Due to their energy, charge neutrality, and chemical specificity, the use of neutral atomic species with energies on the order of chemical bond strengths (a few electron volts (eVs)) offers many advantages over more conventional approaches for materials processing involving etching and thin film growth. The high kinetic energy of the atoms and molecules in the collimated flux circumvent the need for thermal activation of the substrate, and allow the nanostructures to be formed at lower substrate temperatures. These advantages in turn permit the use of some substrates, such as the polymeric substrates described herein, which would otherwise sustain substantial damage due to high processing temperatures. In one embodiment, the substrate is heated up to about 500° C. during processing. In another embodiment, the substrate is heated to a temperature in a range from about 20° C. to about 100° C. during processing. In yet another embodiment, the substrate is maintained at near ambient (i.e., about 30° C.) temperature. To achieve high etch rates over large areas, a high flux of atomic species is required. Energetic Neutral Atom Beam Lithography and epitaxy (also referred to herein as "ENABLE"), schematically illustrated in FIG. 2, is capable of providing the necessary flux of atomic species. ENABLE utilizes a neutral atomic beam source that produces energetic species (O or N atoms) with kinetic energies in a range from about 0.5 eV to about 5 eV and a collimated flux of about $10^{17}$ atoms/cm$^2$ sec (which is equivalent to about 100 monolayers/sec) over an area of approximately 20 cm$^2$.

The generation of the collimated flux of energetic neutral atoms and molecules by ENABLE is described in U.S. Pat. No. 4,780,608 by Jon B. Cross et al., entitled "Laser Sustained Discharge Nozzle Apparatus for the Production of an Intense Beam of High Kinetic Energy Atomic Species," issued Oct. 25, 1988; U.S. Pat. No. 5,271,800 by Steven L. Koontz et al., entitled "Method for Anisotropic Etching in the Manufacture of Semiconductor Devices," issued Dec. 21, 1993; and U.S. Pat. No. 6,168,967 by Mark A. Hoffbauer et al., entitled "Reduction of Surface Leakage Current by Surface Passivation of CdZnTe and Related Materials using Hyperthermal Oxygen Atoms," issued Jan. 2, 2001; and U.S. patent application Ser. No. 10/102,303 by A. Mueller et al., entitled "Colloidal Quantum Dot Light Emitting Diodes," filed Mar. 25, 2004, the contents of which are incorporated by reference herein in their entirety.

Highly anisotropic etching occurs when energetic oxygen atoms impinge upon polymer surfaces to form volatile reaction products, such as CO, $CO_2$, $H_2O$, and the like, as illustrated in FIG. 2a. Due to the inherent properties (charge neutrality, directionality, and ~98% atomic content) of the energetic O-atom beam and the very direct chemistry involving the interaction of energetic oxygen atoms with polymer surfaces, reproduction of. mask features into polymeric films takes place without significant undercutting or tapering effects that are characteristic of other polymer etching techniques. In the present invention, the ENABLE technique has been used to etch substrates such as, but not limited to polyimides, polymethyl methacrylate, Shipley SU-8 photoresist, polycarbonates, perfluorinated cyclobutane, highly oriented pyrolytic carbon, glassy carbon, diamond, and the like. Specific polymer characteristics such as density, hardness, and other chemical and structural properties may result in some variability in feature fidelity. For example, the poor mechanical stability of certain polymers limits the aspect ratios that can be reproducibly attained or imaged for nanoscale features.

To be suitable for ENABLE etching, polymer substrate surfaces must first be patterned with a mask material that does not react with energetic O-atoms to form volatile reaction products. A variety of techniques known in the art, including photolithography, e-beam lithography, nanosphere lithography, and the like may be used for masking polymeric substrates. When the sample is exposed to the incident collimated beam of atomic oxygen, the unprotected areas are anisotropically etched away, leaving the underlying masked polymer substrate intact.

Figure 3:
FIG. 3 is a scanning electron microscopy (SEM) image of a polyimide film, masked with chromium stripes, after etching with ENABLE.

FIG. 3 shows a scanning electron microscopy (SEM) image of a polyimide film, having a thickness of about 2 µm, masked with chromium stripes, each having a width of ~2 µm, after etching with ENABLE at a rate of ~150 nm/min using oxygen atoms having an average kinetic energy of about 2.1 eV. The mask edge roughness (caused by the lift-off procedure) produced numerous features as small as about 30 nm that were precisely transferred by etching through the entire polyimide film down to the substrate with no discernable distortion. A Cr-mask defect feature, labeled A in FIG. 3, results in an etched polyimide structure that is approximately 350 nm wide and only about 30 nm thick. Features with sizes of less than about 10 nm are possible due to the inherent beam properties—such as small de Broglie wavelength and complete charge neutrality of the energetic oxygen—of the ENABLE technique. For example, the de Broglie wavelength of a 3 eV neutral O-atom beam is about 0.004 nm.

Figure 4:
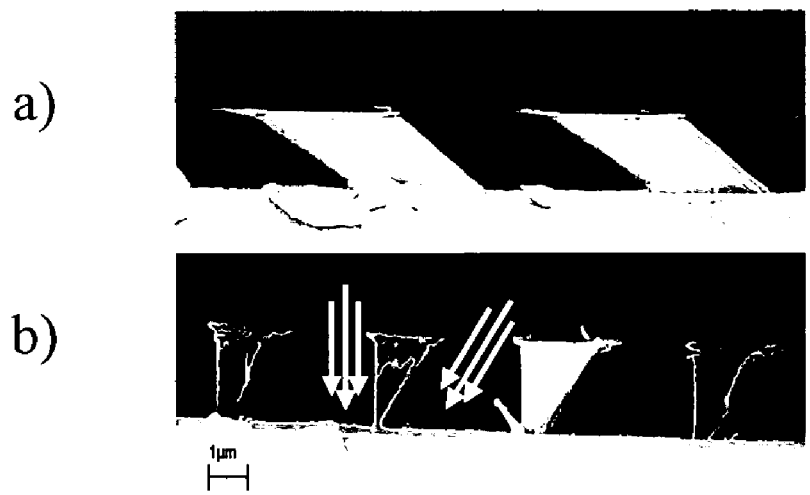
FIG. 4 is an SEM image showing etching of same masked polymeric structures with the incident oxygen atom beam a) at ~45° to the sample surface; and b) at normal and ~30° angles.

The intrinsic directionality of the atomic beam flux provided with ENABLE allows slanted features to be etched directly into polymeric substrates by changing the angle of incidence of the collimated atomic beam relative to the surface normal. The SEM image in FIG. 4 demonstrates etching of the same masked polymeric structures discussed above with the incident O-atom beam at about 45° to the sample surface (FIG. 4a) and at two consecutive angles, normal and about 30° (FIG. 4b). The combination of the direct reaction chemistry involving energetic O-atom atoms with polymeric surfaces and the low reactivity of diffusely scattered O-atoms allows highly anisotropic structures to be etched.

Figure 5:
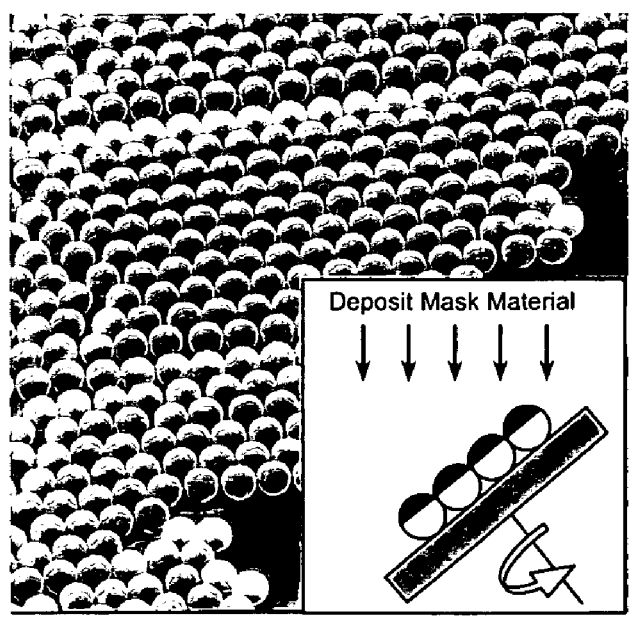
FIG. 5 is an SEM image of an etch mask comprising a two-dimensional array of polystyrene nanospheres on a surface of a polymeric substrate and a schematic representation (inset) of the deposition of a non-reactive layer onto the spheres at an off-normal incidence angle while the sample is rotated about the surface normal.

To etch submicron structures over large areas, nanosphere lithography has been used to assemble two-dimensional arrays of polystyrene or silica nanospheres on surfaces of polymeric substrates to serve as etch masks. An SEM image of such an array is shown in FIG. 5. To assemble such arrays, a suspension of 400 nm diameter polystyrene nanospheres are spin-cast onto a variety of polymeric surfaces. The rotational frequency and the concentration of the nanosphere solution may be empirically determined to yield a monolayer of nanospheres with long-range ordered domains over areas of a few hundreds of square microns on the polymer surfaces. To be used as masks for ENABLE-based etching, the polystyrene spheres are protected from incident oxygen beam erosion by depositing a thin layer of a non-reactive coating onto their surfaces. Using a commercial SEM sputter coater, a non-reactive layer, such as, for example, one comprising gold and palladium, may be deposited onto the spheres at an off-normal incidence angle while the sample is rotated about the surface normal, as illustrated by the inset in FIG. 5. Deposition of such a non-reactive metal layer onto the sample at normal incidence angle would coat both the upper part of the nanospheres as well as the interstitial openings, rendering the entire surface unreactive to ENABLE etching. By carefully choosing the angle for non-reactive metal layer deposition, it is possible to selectively coat only the upper parts of the nanospheres while preventing metal deposition into the interstitial sites on the polymeric substrate. The non-reactive metal coating protects the nanosphere surfaces from reacting with atomic oxygen while leaving the interstitial gaps on the polymeric substrate uncoated, thereby allowing the underlying polymer to be subsequently etched using ENABLE at normal incidence.

Figure 6:
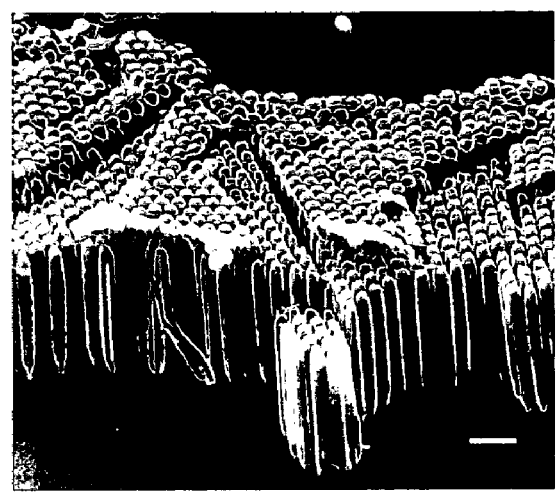
FIG. 6 is an SEM image of an array of 3.1 μm tall posts etched on a substrate using ENABLE.
Figure 7:
FIG. 7 is an SEM image of an array of posts each having a having 200 nm diameter and an aspect ration of 35:1, etched on a substrate using ENABLE.

FIG. 6 is an SEM image of an array of 3.1 µm tall posts etched by ENABLE using ~2.8 eV O-atoms at a rate of about 170 nm/min into a polyimide film using a mask comprising 400 nm spheres coated with about 5 nm of Au:Pd. Some rounding at the tops of the posts is likely due to limited undercutting caused by scattering of energetic O-atoms from the hemispherically shaped mask. Dependence of etch profiles—in particular edge definition and sharpness—on details associated with mask shapes is observed in some instances. Another example of posts etched using ENABLE is shown in FIG. 7. The posts were etched using 250 nm diameter nanospheres assembled on a 5.4 micron thick polyimide film. The SEM image shows large arrays of 200 nm diameter pillars having aspect ratios of at least 35:1. In general, the precisely etched individual pillars have well-defined vertical sidewalls with only minor degradation in shape at their tops.

Figure 8:
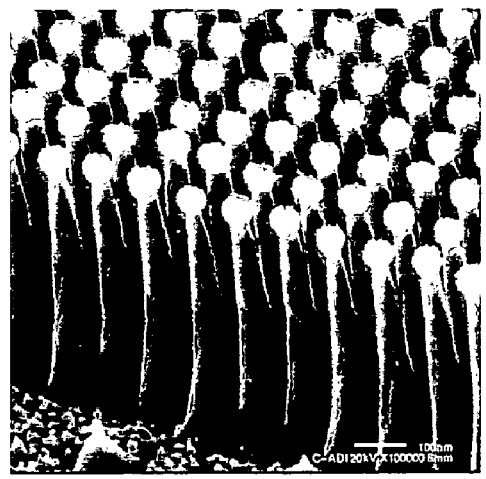
FIG. 8 is a series of SEM images of nanostructures obtained by O-atom etching of glassy carbon.
Figure 8:
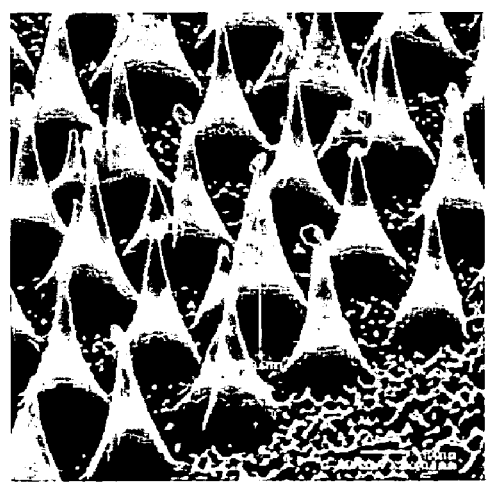
Figure 8:

In some instances, the dependence of etch profiles—in particular, edge definition and sharpness—on details associated with mask shapes is observed. Conical structures with various degrees of tapering may be fabricated by adjusting the energies of the incident oxygen atoms and tailoring the mask shapes and materials. Examples of such nanostructures are shown in FIG. 8 for ~2 eV O-atom etching of glassy carbon at etch rates of about 100 nm/min.

The invention also includes a plurality of nanostructures disposed on a substrate formed by the methods described herein. The nanostructures are formed by providing a substrate that is reactive with energetic atoms of at least one of oxygen and nitrogen; introducing at least one of oxygen and nitrogen into a plasma within a plasma source, wherein the plasma energizes, dissociates, and heats at least one of oxygen and nitrogen; extracting a collimated flux of energetic neutral atoms and molecules of at least one of oxygen and nitrogen from the plasma source; and directing the collimated flux from the plasma source onto a surface of the substrate to etch the substrate, wherein etching the substrate forms the plurality of nanostructures the plurality of nanostructures, wherein the energetic neutral atoms and molecules in the collimated flux have an average kinetic energy in a range from about 1 eV to about 5 eV. Examples of such nanostructures include, but are not limited to, etched structures, examples of which are shown in FIGS. 6 and 7.

The invention also provides an article comprising a plurality of etched nanostructures disposed on a surface of a substrate. Each of the plurality of etched nanostructures has an aspect ratio (i.e., the ratio of the length of the nanostructure to its width) of at least 5:1 and, in some embodiments, at least 10:1. In one embodiment, the aspect ratio of each of the nanostructures has a value of up to about 35:1. Examples of such etched nanostructures are shown in FIGS. 6 and 7. Each nanostructure may be oriented such that an axis of the nanostructure forms an acute angle with the surface of the substrate, as shown in FIGS. 4a and 4b. The etched nanostructures are preferably formed using the methods of etching described herein.

While typical embodiments have been set forth for the purpose of illustration, the foregoing description should not be deemed to be a limitation on the scope of the invention. Accordingly, various modifications, adaptations, and alternatives may occur to one skilled in the art without departing from the spirit and scope of the present invention.

The invention claimed is:

1. A method of forming a plurality of nanostructures on a substrate, the method comprising the steps of:
   a. providing the substrate;
   b. introducing at least one of oxygen and nitrogen into a plasma within a plasma source, wherein the plasma energizes, dissociates, and heats the at least one of oxygen and nitrogen;

c. extracting a collimated flux of energetic neutral atoms and molecules of at least one of oxygen and nitrogen from the plasma source; and d. directing the collimated flux from the plasma source onto a surface of the substrate to etch the substrate, wherein etching the substrate forms the plurality of nanostructures, wherein the neutral atoms and molecules in the collimated flux have an average kinetic energy in a range from about 1 eV to about 5 eV.

2. The method according to claim 1, wherein the substrate is reactive with energetic atoms of at least one of oxygen and nitrogen.

3. The method according to claim 2, wherein the substrate is a polymeric substrate.

4. The method according to claim 3, wherein the polymeric substrate is templated.

5. The method according to claim 2, wherein the polymeric substrate is one of a polyimide, polymethyl methacrylate, Shipley SU-8, a polycarbonate, perfluorinated cyclobutane, and combinations thereof.

6. The method according to claim 2, wherein the substrate is one of highly oriented pyrolytic carbon, glassy carbon, and diamond.

7. The method according to claim 1, wherein the collimated flux is a flux of at least $10^{14}$ neutral atoms and molecules/cm$^2$·sec.

8. The method according to claim 7, wherein the collimated flux is a flux in a range from about $10^{14}$ neutral atoms and molecules/cm$^2$·sec to about $10^{18}$ neutral atoms and molecules/cm$^2$·sec.

9. The method according to claim 1, wherein the collimated flux is directed at the surface at an off-normal incidence angle to the surface.

10. The method according to claim 9, wherein each of the plurality of nanostructures formed has an axis that forms an acute angle with the surface of the substrate.

11. A method of etching a substrate, the method comprising the steps of:

a. providing the substrate, wherein the substrate is reactive with energetic atoms of at least one of atomic oxygen and nitrogen and a surface having a masked portion and an unmasked portion; and b. introducing at least one of oxygen and nitrogen into a plasma within a plasma source, wherein the plasma energizes, dissociates, and heats the at least one of oxygen and nitrogen;

c. extracting a collimated flux of energetic neutral atoms and molecules of at least one of oxygen and nitrogen from the plasma source; and d. directing the collimated flux from the plasma source onto the surface of the substrate to etch the unmasked portion of the substrate, wherein the energetic neutral atoms and the molecules in the collimated flux have an average kinetic energy in a range from about 1 eV to about 5 eV.

12. The method according to claim 11, wherein the step of providing a substrate comprises providing a templated substrate.

13. The method according to claim 11, wherein the substrate is a polymeric substrate.

14. The method according to claim 13, wherein the polymeric substrate is one of a polyimide, polymethyl methacrylate, Shipley SU-8, a polycarbonate, perfluorinated cyclobutane, and combinations thereof.

15. The method according to claim 11, wherein the substrate is one of highly oriented pyrolytic carbon, glassy carbon, and diamond.

16. The method according to claim 11, wherein the collimated flux is a flux of at least $10^{14}$ neutral atoms and molecules/cm$^2$·sec.

17. The method according to claim 16, wherein the collimated flux is a flux in a range from about $10^{14}$ neutral atoms and molecules/cm$^2$·sec to about $10^{18}$ neutral atoms and molecules/cm$^2$·sec.

18. The method according to claim 11, wherein the step of providing a templated substrate comprises:

a. disposing a two dimensional array of a plurality of nanospheres on a surface of the substrate;

b. directing a beam of a gaseous material at an off-normal incidence angle at the surface, wherein the gaseous material forms a non-reactive layer on the plurality of nanospheres; and c. directing the collimated flux from the plasma source onto the surface of the substrate at normal incidence.

19. The method according to claim 11, wherein the collimated flux is directed at the surface at an off-normal incidence angle to the surface, to etch the unmasked portion of the surface and form a plurality of etched nanostructures, wherein each of the plurality of etched nanostructures formed has an axis that forms an acute angle with the surface of the substrate.

* * * * *